US008118535B2

(12) United States Patent
Gifford et al.

(10) Patent No.: US 8,118,535 B2
(45) Date of Patent: Feb. 21, 2012

(54) POD SWAPPING INTERNAL TO TOOL RUN TIME

(75) Inventors: Jeffrey P. Gifford, Fishkill, NY (US); Edward Sherwood, Wingdale, NY (US)

(73) Assignee: International Business Machines Corporation, Armonk, NY (US)

( * ) Notice: Subject to any disclaimer, the term of this patent is extended or adjusted under 35 U.S.C. 154(b) by 1483 days.

(21) Appl. No.: 10/908,594

(22) Filed: May 18, 2005

(65) Prior Publication Data

US 2006/0263197 A1    Nov. 23, 2006

(51) Int. Cl.
*B65B 69/00* (2006.01)
(52) U.S. Cl. .................. 414/810; 414/939; 414/940
(58) Field of Classification Search ............. 414/939
See application file for complete search history.

(56) References Cited

U.S. PATENT DOCUMENTS

| | | | | |
|---|---|---|---|---|
| 5,145,303 A * | 9/1992 | Clarke | ............................ | 414/217 |
| 5,203,360 A * | 4/1993 | Nguyen et al. | .................... | 134/78 |
| 5,658,123 A * | 8/1997 | Goff et al. | ....................... | 414/805 |
| 5,663,884 A * | 9/1997 | Nishihata et al. | .............. | 700/121 |
| 5,772,386 A * | 6/1998 | Mages et al. | ................... | 414/411 |
| 5,944,940 A * | 8/1999 | Toshima | .................. | 156/345.29 |
| 6,030,208 A | 2/2000 | Williams et al. | | |
| 6,042,324 A | 3/2000 | Aggarwal et al. | | |
| 6,095,335 A | 8/2000 | Busby | | |
| 6,183,186 B1 * | 2/2001 | Howells et al. | ........... | 414/416.03 |
| 6,244,812 B1 | 6/2001 | Patterson et al. | | |
| 6,322,633 B1 | 11/2001 | Bexten et al. | | |
| 6,382,896 B1 | 5/2002 | Hu et al. | | |
| 6,389,706 B1 | 5/2002 | Kuebart et al. | | |
| 6,412,502 B1 | 7/2002 | Bexten et al. | | |
| 6,413,037 B1 * | 7/2002 | Brodine | ........................ | 294/64.1 |
| 6,419,438 B1 | 7/2002 | Rosenquist | | |
| 6,428,262 B1 | 8/2002 | Vanderpot et al. | | |
| 6,470,927 B2 | 10/2002 | Otaguro | | |
| 6,585,470 B2 * | 7/2003 | Van Der Meulen | ............ | 414/217 |
| 6,592,318 B2 | 7/2003 | Aggarwal | | |
| 6,632,068 B2 | 10/2003 | Zinger et al. | | |
| 6,712,577 B2 * | 3/2004 | Davis et al. | .................... | 414/217 |
| 6,730,604 B1 | 5/2004 | Liu et al. | | |
| 6,748,293 B1 * | 6/2004 | Larsen | ........................... | 700/218 |
| 6,778,879 B2 * | 8/2004 | Chang et al. | ................... | 700/223 |
| 6,824,344 B2 | 11/2004 | Otaguro | | |
| 6,835,039 B2 | 12/2004 | van den Berg et al. | | |
| 6,867,153 B2 | 3/2005 | Tokunaga | | |
| 6,962,471 B2 * | 11/2005 | Birkner et al. | ................. | 414/217 |
| 7,005,009 B2 * | 2/2006 | Aoki et al. | ....................... | 118/66 |
| 7,024,275 B2 * | 4/2006 | Lai | ................................. | 700/228 |
| 7,080,652 B2 * | 7/2006 | Davis et al. | .................... | 134/133 |

(Continued)

*Primary Examiner* — Joshua Rudawitz
(74) *Attorney, Agent, or Firm* — DeLio & Peterson, LLC; Kelly M. Nowak; Katherine S. Brown

(57) ABSTRACT

Methods, systems and apparatus for swapping pods within a semiconductor processing tool during a substrate processing cycle. A dirty pod carrying a substrate in need of processing is provided within the processing tool, and the substrate is transferred into a processing chamber thereof. At least one clean pod is also provided within the processing tool. Upon substrate processing completion, the processed substrate is transferred from the chamber directly into a clean pod within the processing tool. Wherein a plurality of substrates are processed within the chamber, a plurality of clean pods may be provided within the tool whereby the plurality of substrates are transferred into a single clean pod or split into subsets that are transferred into different clean pods within the processing tool. The clean pod(s) carrying the processed substrate(s) are then transferred to other tool(s) for continued semiconductor fabrication processing.

17 Claims, 5 Drawing Sheets

U.S. PATENT DOCUMENTS

| | | |
|---|---|---|
| 7,198,448 B2 * | 4/2007 | Ozawa et al. ........ 414/217 |
| 2002/0015636 A1 | 2/2002 | Lee et al. |
| 2002/0033606 A1 | 3/2002 | Kimoto et al. |
| 2002/0044859 A1 | 4/2002 | Lee et al. |
| 2002/0064439 A1 | 5/2002 | Otaguro |
| 2002/0069933 A1 | 6/2002 | Otaguro |
| 2002/0099470 A1 | 7/2002 | Zinger et al. |
| 2002/0182790 A1 | 12/2002 | Kim |
| 2003/0012626 A1 | 1/2003 | Aggarwal |
| 2003/0012627 A1 | 1/2003 | Lee et al. |
| 2003/0099527 A1 | 5/2003 | Mitsuyoshi |
| 2003/0119214 A1 | 6/2003 | Kitazawa et al. |
| 2003/0121870 A1 | 7/2003 | Beckhart et al. |
| 2003/0161714 A1 | 8/2003 | Blattner et al. |
| 2003/0164179 A1 | 9/2003 | Kamikawa et al. |
| 2003/0180125 A1 | 9/2003 | van den Berg et al. |
| 2003/0199173 A1 | 10/2003 | Ogawa et al. |
| 2003/0210971 A1 | 11/2003 | Lee et al. |
| 2004/0037675 A1 | 2/2004 | Zinger et al. |
| 2004/0069409 A1 | 4/2004 | Wu et al. |
| 2004/0073331 A1 | 4/2004 | Chang et al. |
| 2004/0091337 A1 | 5/2004 | Lee et al. |
| 2004/0105738 A1 | 6/2004 | Ahn et al. |
| 2004/0152322 A1 | 8/2004 | Tokunaga |
| 2004/0182472 A1 | 9/2004 | Aggarwal |
| 2004/0191046 A1 | 9/2004 | Mitsuyoshi |
| 2004/0228712 A1 | 11/2004 | Nam et al. |
| 2004/0234360 A1 | 11/2004 | Hayashi |
| 2004/0237244 A1 | 12/2004 | Suzuki et al. |
| 2004/0258840 A1 | 12/2004 | Chen |

* cited by examiner

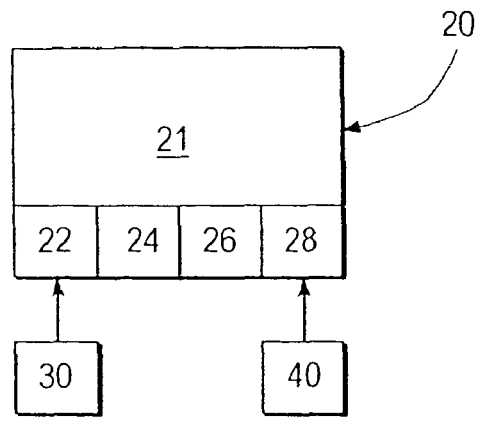
F I G. 2A
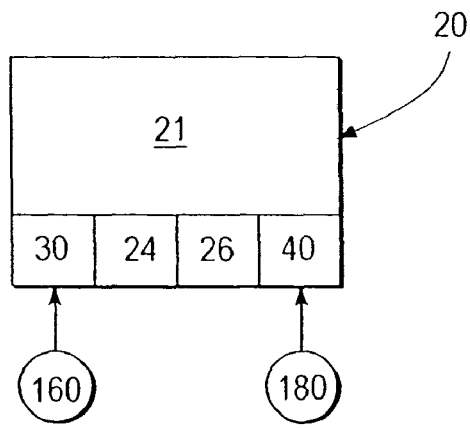
F I G. 2B
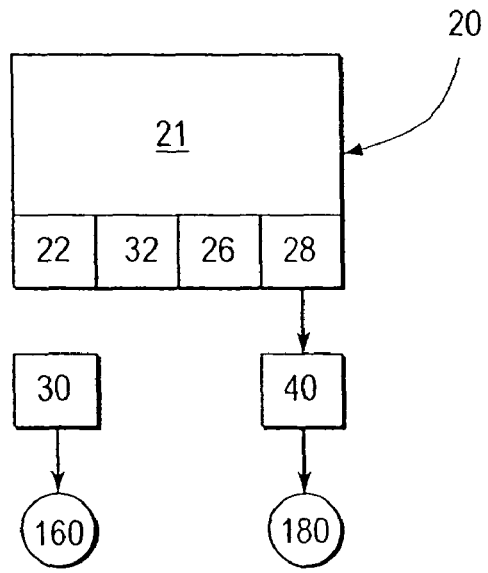
F I G. 2C

POD SWAPPING INTERNAL TO TOOL RUN TIME

BACKGROUND OF THE INVENTION

1. Field of the Invention

This present invention relates to semiconductor substrate handling equipment, and in particular, to swapping front-opening unified pods (FOUP) within a processing tool during the tool run time.

2. Description of Related Art

Semiconductor wafers, or other such substrates, are typically subjected to many processing steps that involve moving a cassette of wafers from one type of apparatus to another. For example, wafers contained within a wafer-storage cassette may be moved individually to a processing chamber for depositing and patterning layers of material for forming integrated circuit chips.

During semiconductor manufacturing, it is essential that the processed wafers be kept isolated from contamination when being transferred. As such, robotic handling devices are often used since human handling is more likely to cause contamination. These robotic handling devices store and transfer the wafer-storage cassettes within a sealed box or pod. One such pod is known as a Front Opening Unified Pod (FOUP). Automated transfer systems have been designed for use with FOUPs for lifting and lowering the FOUPs by automated material handling systems (AMHS).

A FOUP protects wafers from contamination by moving the wafers within a sealed environment. In so doing, each FOUP includes a door with an opening portion and a load port for opening/closing the opening portion. The FOUP door faces the opening portion of the load port. When wafers are loaded into the FOUP, the door opens, wafers are robotically conveyed into the FOUP opening portion, and the door closes to enclose the wafers within the FOUP. Likewise, in unloading the FOUP, the door opens, wafers are robotically transferred from the FOUP opening portion, and the door closes to provide an empty FOUP.

The practice of swapping wafers from one FOUP to another, hereinafter referred to as "FOUP swapping", is used in a number of different semiconductor fabrication processing techniques. For instance, FOUP swapping is used for contamination protection, whereby wafers are moved from a "dirty" FOUP into a "clean" FOUP. An external mapper/sorter tool is used to swap the wafers from the dirty FOUP into the clean FOUP. After the swap is complete, the wafers are conveyed to the next processing step within the clean FOUP, and the dirty FOUP is cleaned for reuse. FOUP swapping is also used for process segregation to keep specific types of wafers separated from other types of wafers, such as, from keeping non-copper wafers away from those wafers having copper processing levels. A number of different designated external mappers are often used for process segregation FOUP swaps.

Split and merge routing/recipe operations also involve FOUP swapping. A split occurs when a selected subset of wafers within a FOUP is required to follow an alternate process path as compared to other wafers within the FOUP. The wafers within the FOUP are robotically transferred to an external mapper, wherein the wafers are then split into different FOUPs for transferring the different subsets of wafers to different processing tools for carrying out the various semiconductor fabrication techniques. FOUP swapping is also used during FOUP maintenance techniques whereby wafers are removed from a FOUP in need of repair and transferred to another FOUP. FOUP maintenance also involves the use of an external mapper tool.

FIG. 1 shows a conventional FOUP swapping technique and process flow. A set of wafers is robotically transferred into a dirty FOUP 6 (step 10). FOUP 6 is referred to herein as the "dirty FOUP" since it receives and carries unprocessed wafers from an unclean environment, and/or it may have been exposed to contaminants residing on the unprocessed wafers themselves. The set of wafers are transferred into a processing tool 2 via FOUP 6, and unloaded into a chamber of this processing tool 2 (step 12). Upon wafer processing completion, the processed wafers are transferred from the processing tool back into the dirty FOUP 6 for transport to a mapper/sorter tool 4 (step 13). Undesirably, this step leads to the contamination and/or re-contamination of the processed wafers.

Also robotically transferred and sealed to the mapper tool 4 is an empty clean FOUP 8 (step 14). The FOUP 8 is referred to herein as the "clean FOUP" since it does not receive unprocessed wafers from a potentially unclean environment for transferring such wafers to a processing tool. Once the dirty FOUP 6 is sealed to the mapper tool 4, the processed wafers are unloaded from the dirty FOUP 6 into the mapper tool 4 (step 15), and the empty, dirty FOUP 6 is sent for cleaning (step 16). The mapper tool 4 transfers the processed wafers into the clean FOUP 8 (step 17), and these wafers are then carried to the next semiconductor fabrication process within FOUP 8 (step 18).

However, since the processed wafers may have been contaminated once transferred back into the dirty FOUP 6 in step 13, these contaminated processed wafers may also be transferred into the mapper tool, into the clean FOUP 8 and may deleteriously affect further processing techniques. Inventions that can improve FOUP swapping techniques are highly desirable since the current techniques are costly, at increased risk of wafer contamination, require numerous processing steps, time consuming, require increased AMHS traffic, and are inefficient.

SUMMARY OF THE INVENTION

Bearing in mind the problems and deficiencies of the prior art, it is therefore an object of the present invention to provide methods, systems and apparatus for FOUP swapping within a semiconductor fabrication processing tool during such tool run time.

It is another object of the present invention to provide methods, systems and apparatus that reduce contamination during FOUP swapping.

Another object of the present invention is to provide methods, systems and apparatus for FOUP swapping having reduced AMHS traffic.

A further object of the invention is to provide methods, systems and apparatus that eliminate the need of transferring a dirty FOUP carrying processed wafers to a separate external mapper or sorter tool.

Yet another object of the present invention is to provide methods, systems and apparatus that avoid reuse of dirty FOUPs.

Another object of the present invention is to provide methods, systems and apparatus for FOUP swapping having reduced processing steps, and as such, are efficient, cost effective and have reduced product cycle time.

Still other objects and advantages of the invention will in part be obvious and will in part be apparent from the specification.

The above and other objects, which will be apparent to those skilled in art, are achieved in the present invention, which is directed to in a first aspect a method of swapping pods within a processing tool. The method includes providing a dirty pod carrying a substrate in need of processing within a processing tool, and transferring the substrate from the dirty pod into a chamber of the processing tool for processing therein. Also provided within the processing tool is a clean pod. Upon substrate processing completion, the processed substrate is transferred from the chamber directly into the clean pod within the processing tool. These dirty and clean pods are preferably front opening unified pods.

In accordance with the method of the invention, by transferring the processed substrate from the chamber directly into the clean pod within the processing tool, contamination of the processed substrate is significantly reduced. Also, the dirty pod may be received at a first available loading port of the processing tool, while the clean pod is received at a second available loading port thereof. These dirty and clean pods may be provided within the processing tool either simultaneously or concurrently, however an essential feature is that the clean pod be provided within the processing tool prior to substrate processing completion.

Further, the dirty pod may be received at a first loading port of the processing tool, whereby the substrate(s) within the dirty pod is then transferred into the processing chamber. The dirty pod may be removed from the first loading port, and then a clean pod received at such first loading port. Upon substrate processing completion, the processed substrate is transferred from the chamber directly into the clean pod residing within the first loading port. Once the dirty pod is removed from the processing tool, a second dirty pod carrying a second substrate in need of processing may be provided within the processing tool. In this aspect, once the first substrate has been processed and transferred into the first clean pod, the second substrate is then transferred into the processing chamber for processing therein, and a second clean pod for receiving the processed second substrate is received at the processing tool. These steps are repeated until all desired substrates have been processed within the processing tool.

Still in accordance with this aspect of the invention the dirty pod may be carrying a plurality of substrates in need of processing. These plurality of substrates are transferred into and processed within the chamber of the processing tool. Once substrate processing is complete, the processed plurality of substrates may be transferred to a single clean pod residing within the processing tool or a plurality of clean pods within the processing tool. Wherein a plurality of clean pods have been delivered to and reside within the processing tool, the invention may split the processed plurality of substrates into subsets of processed substrates, and then transfer these subsets of processed substrates from the processing chamber directly into the plurality of clean pods residing within the processing tool.

In another aspect, the invention is directed to a system for swapping pods within a semiconductor processing tool. The system includes a processing tool having a loading port and a processing chamber, a dirty pod carrying a substrate in need of processing, a clean pod and a set of instructions having a plurality of commands. These commands include a first command for transmitting the dirty pod into the loading port, a second command for transferring the substrate into the processing chamber for processing therein, and a third command for transmitting the clean pod within the processing tool prior to substrate processing completion. The set of instructions also include a fourth command for transferring the processed substrate from the processing chamber directly into the clean pod within the processing tool.

In still another aspect, the invention is directed to a program storage device readable by a processor capable of executing instructions, tangibly embodying a program of instructions executable by the processor to perform method steps for swapping pods within a processing tool. These method steps include providing a dirty pod carrying at least one substrate in need of processing within a processing tool, and then transferring such substrate into a chamber of the processing tool for processing therein. Also provided within the processing tool is at least one clean pod, whereby upon substrate processing completion, the processed at least one substrate is transferred from the chamber directly into the at least one clean pod within the processing tool.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

FIG. 2A is an embodiment of the invention showing a processing tool having a plurality of loading ports for receiving both a dirty pod and a clean pod.

FIG. 2B is an illustration of the tool of FIG. 2A wherein a first load port receives the dirty pod while a second load port receives the clean pod.

FIG. 2C is an illustration of the tool of FIG. 2B showing the dirty pod sent to a cleaning operation, the clean pod carrying processed substrates sent to continued semiconductor fabrication steps.

DESCRIPTION OF THE PREFERRED EMBODIMENT(S)

Figure 1:
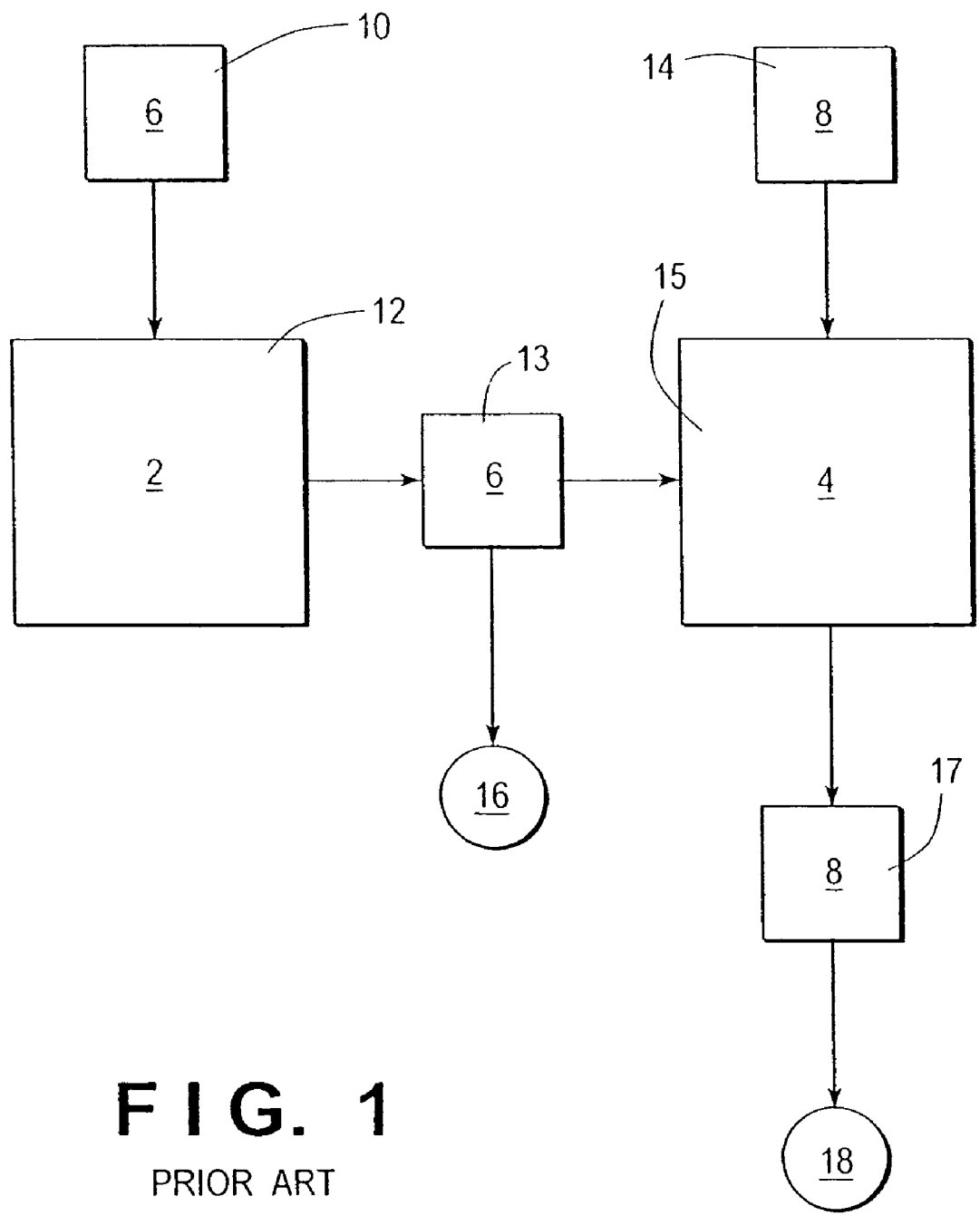
FIG. 1 is a prior art illustration of a conventional FOUP swapping operations utilizing a separate, external mapper or sorter tool.

In describing the preferred embodiment of the present invention, reference will be made herein to FIGS. 2A-5 of the drawings in which like numerals refer to like features of the invention.

The present invention is directed to performing pod swapping simultaneously while substrates are being processed in a processing tool for semiconductor fabrication. It should be understood and appreciated that the invention may be used with a variety of known sealed boxes or pods used during semiconductor fabrication operations for transporting substrates including, but not limited to, Front Opening Unified Pods (FOUP) for transporting wafer(s), reticle pods for transporting reticle(s), and the like. However, for ease of understanding the invention, preferred embodiments are described in relation to FOUP swapping simultaneously while wafer(s) are being processed within a processing tool. In so doing, a wafer or batch of wafers are swapped from a dirty FOUP to a clean FOUP within a single processing tool during fabrication operations, thereby eliminating the need for an external mapper tool and avoiding any delay in wafer processing and/or semiconductor fabrication.

Referring to FIG. 2A, a first embodiment of the invention shows a processing tool 20 provided with a loading port for receiving wafers in need of processing, preferably a plurality of load ports, such as load ports 22, 24, 26, 28, etc. The processing tool 20 may include any known tool used during semiconductor fabrication processing that involves receiving either a single wafer or batch of wafers held within a sealed pod, and transferring such wafers from the sealed pod into the processing tool. In the preferred embodiments of the invention, the pod is preferably a Front Opening Unified Pod (FOUP), however, it should be appreciated and understood that the sealed pod may include any known sealed container that encloses and carries a wafer or batch of wafers from one processing tool to another.

A first batch of wafers in need of processing are provided within a first FOUP 30. This first FOUP 30 is referred to herein as the dirty FOUP. The unprocessed wafers are carried in the dirty FOUP 30 and transported to the processing tool 20 via a robotic transportation tool, such as, an automated material handling systems, overhead hoist transport systems, and the like. Also dispatched and robotically transferred directly to the processing tool 20 is a second FOUP 40. This second FOUP 40 is referred to herein as the clean FOUP. In accordance with the invention, the processing tool is enabled to receive both the dirty and clean FOUPs.

Once the dirty FOUP 30 and clean FOUP 40 are dispatched and robotically transferred to the processing tool 20, a first load port 22 of the tool 20 receives the dirty FOUP 30 while a second load port 28 of the tool 20 receives the clean FOUP 40, as is shown in FIG. 2B. FOUPs 30 and 40 may be simultaneously dispatched, robotically transferred to and received at processing tool 20, or they may be concurrently dispatched, transferred and received by the processing tool 20. However, an essential feature of the invention is that the clean FOUP 40 is received within a load port of the processing tool and sealed thereto prior to completion of a processing cycle of wafer(s) within the processing tool.

Referring to FIG. 2B, the first load port 22 receives the dirty FOUP 30, and then the FOUP 30 is sealed to the processing tool 20. The first batch of wafers residing within the dirty FOUP 30 are transferred into a chamber 21 of the processing tool 20 for a process cycle that is completed within the tool run time. Once the processing cycle for the first batch of wafers is complete, the processed wafers are transferred from the processing chamber 21 of the tool 20 directly into the clean FOUP 40 residing within the second load port 28 of tool 20, thereby avoiding contamination of the processed wafers. The clean FOUP 40 carrying the processed first batch of wafers is then transferred to another semiconductor fabrication tool for continued semiconductor fabrication processing steps 180, and the empty dirty FOUP 30 is transferred to a cleaning tool for a cleaning step 160. An essential feature of the invention is that the FOUP swapping from a dirty FOUP to a clean FOUP is integrated within the processing tool 20 such that it becomes a step within the processing cycle of the tool occurring within the tool run time.

FIG. 2C shows an alternate embodiment of the invention for increasing the processing rate of tool 20. In this aspect, once the first batch of wafers has been transferred into the processing tool and sealed therein, the first dirty FOUP 30 is removed from the processing tool 20 and sent to a cleaning tool for a cleaning step 160, while the wafers are being processed within the tool 20. This step leaves loading port 22 empty. A second dirty FOUP 32, carrying a second batch of wafers in need of processing, is transported to the processing tool, randomly loaded into one of the load ports of such tool (e.g., loading port 24), and sealed to the processing tool 20, still while the first batch of wafers are being processed. As such, this step of swapping the dirty FOUPs 30, 32 occurs while a single wafer or batch of wafers are being processed within the processing tool.

Again, once the processing cycle for the first batch of wafers is complete, the processed wafers are transferred into the clean FOUP 40 residing within load port 28. Either after the processed first batch of wafers has been transferred into the clean FOUP 40, or simultaneously therewith, the second batch of wafers in the second dirty FOUP 32 is transferred from FOUP 32 into the processing tool 20 for processing therein. In so doing, the FOUP swapping from a dirty FOUP to a clean FOUP is integrated within the processing tool itself, and thereby integrated into the wafer processing cycle (i.e., completed within the process cycle time) such that it occurs internal to the tool run time. The clean FOUP 40 of FIG. 2C carrying the processed first batch of wafers is then transferred to another semiconductor fabrication tool for continued semiconductor fabrication processing steps 180. This process cycle of FOUP swapping within a processing tool, during the tool run time, repeats until all desired wafers have been processed.

Figure 3A:
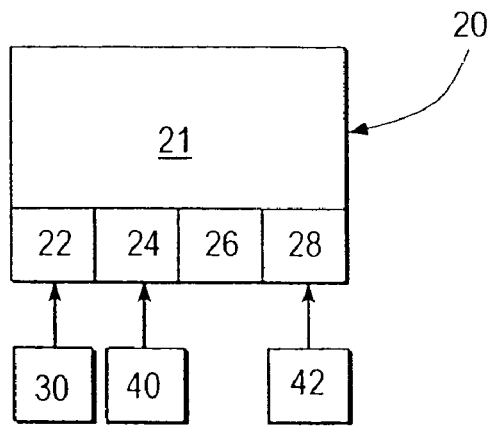
FIG. 3A is another embodiment of the invention showing a processing tool having a plurality of loading ports for receiving both a dirty pod and a number of clean pods.
Figure 3B:
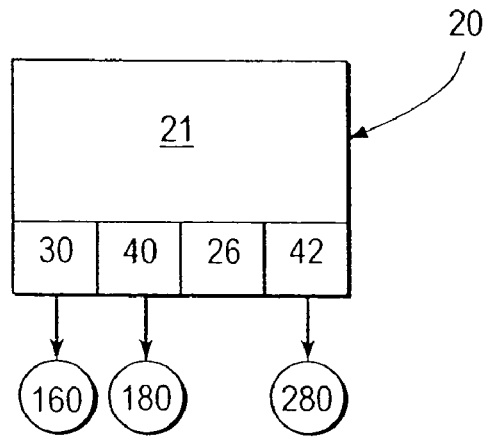
FIG. 3B is an illustration of the tool of FIG. 3A wherein a first load port receives the dirty pod while a second and third loading ports receives the clean pods.
Figure 3C:
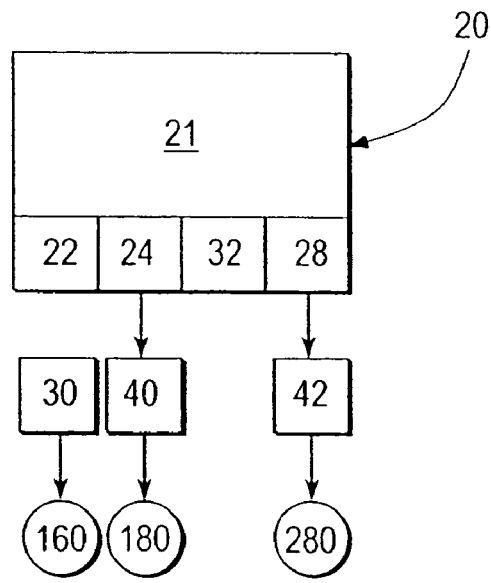
FIG. 3C is an illustration of the tool of FIG. 3B showing the dirty pod sent to a cleaning operation, the various clean pods carrying processed substrates sent to different continued semiconductor fabrication steps, and a second dirty pod received within one of the load ports of the processing tool.

Similarly, a plurality of clean FOUPs may be simultaneously or concurrently received at the processing tool 20 for splitting the processed batch of wafers within the processing tool for continued semiconductor fabrication processing. Referring to FIGS. 3A-C, the dirty FOUP 30 carrying the first batch of wafers is received at a first load port 22 and sealed to tool 20. Two or more clean FOUPs are received at other load ports of the processing tool and sealed thereto. For instance, clean FOUP 40 and clean FOUP 42 may be received respectively at a second load port 24 and a third load port 28 of the processing tool.

Referring to FIG. 3B, the batch of wafers are transferred from the dirty FOUP 30 into the processing tool for processing therein. Once wafer processing is complete, a first set of processed wafers is transferred into the first clean FOUP 40 and a second set of processed wafers is transferred into the second clean FOUP 42. The clean FOUPs 40, 42 carrying the processed sets of wafers are then transferred to other semiconductor fabrication tools for varying semiconductor fabrication processing steps 180, 280. The empty dirty FOUP 30 is transferred to a cleaning tool for a cleaning step 160.

Alternatively, the dirty FOUP 30 may be removed from the tool port and sent to a clean step 160, and a second dirty FOUP 32 carrying a second batch of unprocessed wafers is randomly loading into a loading port (e.g. load port 26) and sealed to the processing tool 20 prior to removing the processed first batch of wafers from the processing tool, as shown in FIG. 3C. Upon completion of the processing cycle of the first batch of wafers, the processed wafers are split into sets and transferred into the various clean FOUPs 40, 42 for continued semiconductor fabrication processing steps 180, 182. The second batch of wafers may be transferred from the dirty FOUP 32 into the processing chamber 21 either after the processed sets of wafers from the first batch are transferred into the clean FOUPs, or simultaneously therewith. In so doing, these processes of swapping dirty FOUPs 30, 32 and swapping from a dirty FOUP 30 to clean FOUPs 40, 42 are all integrated into the processing tool itself, and as such, are integral with the processing cycle and tool run time.

Again, it is an essential feature of the invention that the clean FOUPs be received and sealed to the processing tool 20 prior to completion of the tool run time. More preferably, prior to completion of the wafer processing cycle so that once the wafers are processed, the processed wafers are immediately transferred from the processing tool in predetermined sets directly into the various clean FOUPs residing within loading ports of the processing tool 20.

Figure 4A:
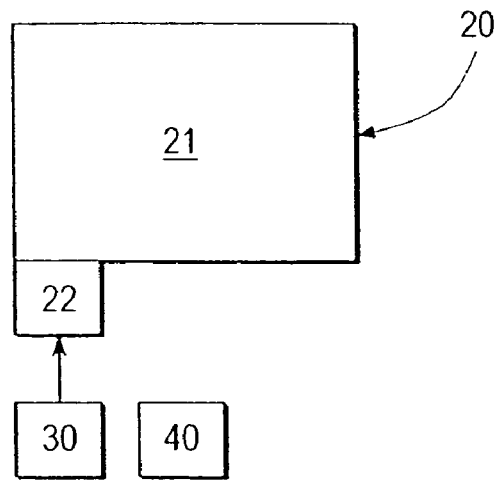
FIG. 4A is yet another embodiment of the invention showing a processing tool having a single loading port for receiving dirty and clean pods.

Referring to FIG. 4A, another embodiment of the invention is shown whereby the processing tool 20 is provided with a single load port 22. In this aspect, the dirty FOUP 30 carrying at least one wafer(s) in need of processing is transported to the load port 22. Upon sealing the dirty FOUP 30 to the processing tool, the wafer(s) is transported into a chamber 21 of the tool 20 for processing therein.

Figure 4B:
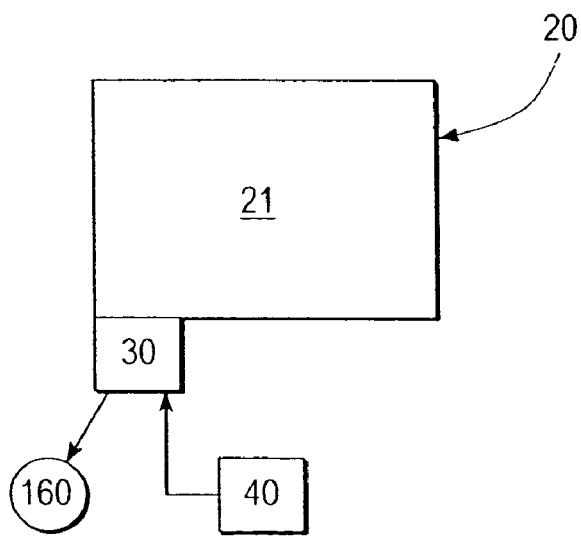
FIG. 4B is an illustration of the tool of FIG. 4A showing the single loading port receiving a dirty pod, whereby substrates in need of processing are loaded into the process tool while the empty dirty pod is replaced with an empty clean pod.

While the wafer(s) is being processed, the now empty dirty FOUP 30 is removed from load port 22 and sent a cleaning tool for a cleaning step 160, as shown in FIG. 4B. An empty clean FOUP 40 is then transferred into the empty load port 22 while the wafer(s) is being processed within tool 20. That is, the FOUP swapping of the invention, i.e., from a dirty FOUP to a clean FOUP, occurs within the processing tool 20 itself, prior to completion of the process cycle of the wafer(s) within such tool 20.

Figure 4C:
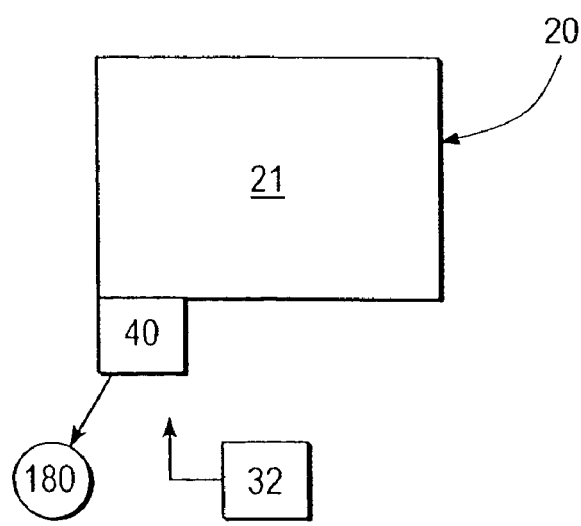
FIG. 4C is an illustration of the tool of FIG. 4B showing the clean pod, having processed substrates therein, being sent to a continued semiconductor fabrication step, and a second dirty pod carrying substrates in need of processing being received within the single loading port of the tool for processing therein.

Once the wafer(s) processing cycle of tool 20 is complete, the processed wafers are transferred into the empty, clean FOUP 40 residing within the load port 22. At this point, as is shown in FIG. 4C, the clean FOUP 40 carrying the processed wafer(s) is transferred to a continued semiconductor process step 180, and a second dirty FOUP 32 carrying wafer(s) in need of processing is transported into the load port 22 for repeating the process flow of the invention. The FOUP swapping process of the invention is repeated and continued until all desired wafers have been processed and the tool run time has come to an end.

Figure 5:
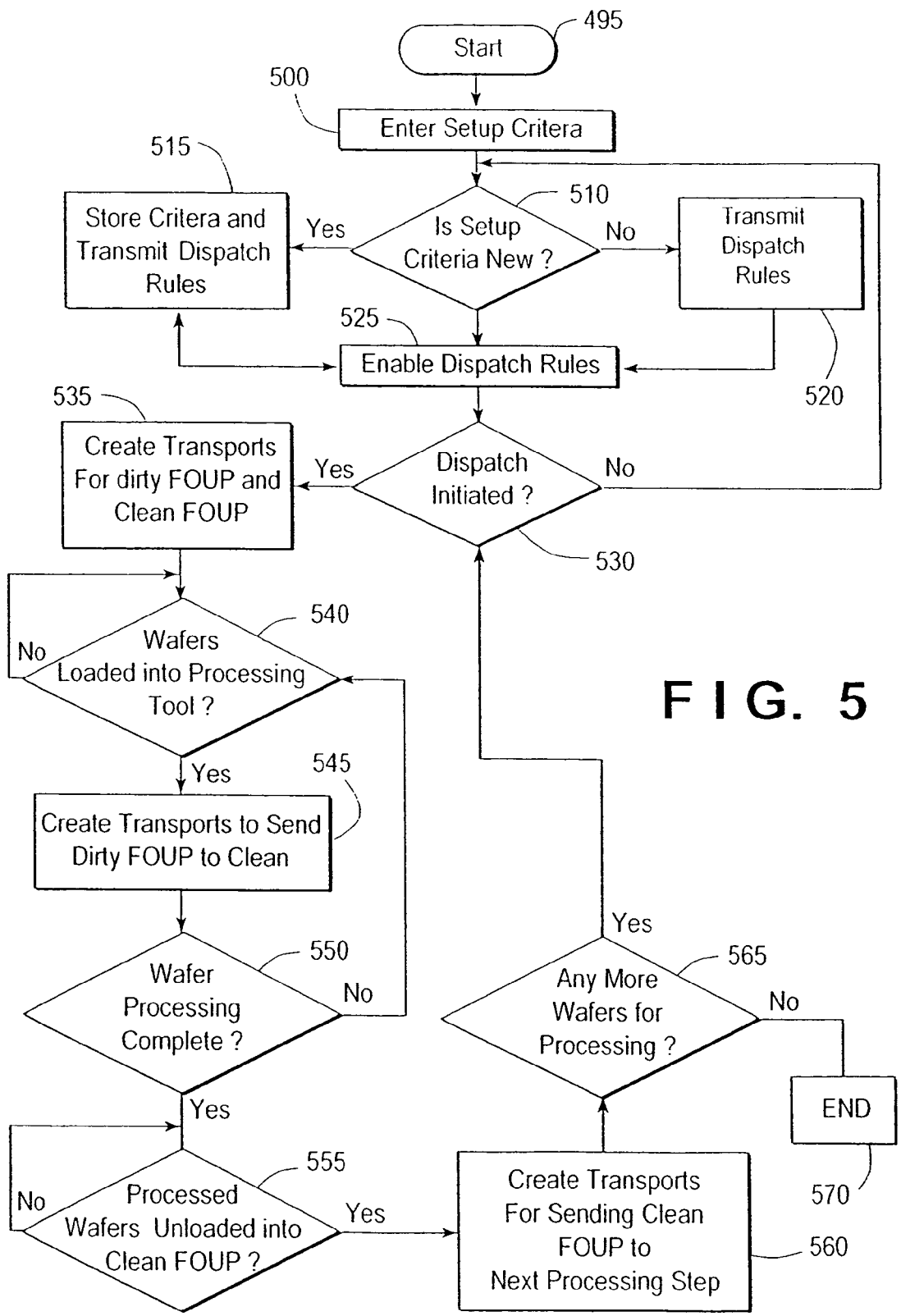
FIG. 5 illustrates a process flow of an embodiment of the invention.

FIG. 5 illustrates an embodiment of a process flow of FOUP swapping in accordance with the invention. In describing the preferred embodiment of the present invention, it should be appreciated that components of the invention may be embodied as a computer program product stored on a program storage device. These program storage devices may be devised, made and used as a component of a machine that utilizes optics, magnetic properties and/or electronics to perform certain of the method steps of the present invention. Such program storage devices may include, but are not limited to, magnetic media such as diskettes or computer hard drives, magnetic tapes, optical disks, Read Only Memory (ROM), floppy disks, semiconductor chips and the like. A computer readable program code means in known source code may be employed to convert certain of the method steps described below. The process flow of FIG. 5 is as follows:

495 Start. Trigger decision to being FOUP swapping operations. The process flow continues to step 500.

500 Enter set up criteria. Processing criteria is determined for a lot of wafers to be processed by a semiconductor fabrication tool including, but not limited to, the number of wafers to be processed, the conditions under which such wafers are to be processed, processing durations, etc. Once determined, the processing criteria is input into the present FOUP swapping system. The process flow continues to step 510.

510 Is set up criteria new? It is then determined whether the input processing criteria is for a new lot of wafers, or alternatively, for a batch of wafers within a lot currently being processed by the process tool. If the set up criteria is for a new lot of wafers, the process flow continues to step 515. If, however, the set up criteria is for a batch of wafers currently being processed, then the process flow continues to step 520.

515 Store criteria and transmit dispatch rules. The criteria for the new lot of wafers is stored within a database, and then processing information and rules relating to such criteria is transmitted to a dispatch component of the system. The process flow continues to step 525.

520 Transmit dispatch rules. Wherein the input processing criteria is for a batch of wafers within a lot currently being processed by the process tool, this input criteria is transmitted to the dispatch component of the system. The process flow continues to step 525.

525 Enable dispatch rules. Once the dispatch component receives either the processing criteria for a new lot of wafers or for a batch of wafers within a lot currently being processed, the dispatch rules and information associated with such criteria are enabled. The process flow continues to step 530.

530 Dispatch initiated? It is then determined whether or not the dispatch rules and information associated with the processing criteria have been initiated. If the dispatch rules and information have not been initiated, the process flow repeats back to step 510, wherein the input processing criteria is re-evaluated again. If, however, the dispatch rules and information have been initiated, the process flow continues to step 535.

535 Create transports for dirty FOUP and clean FOUP. Once the dispatch rules and information have been initiated, transports for a dirty FOUP carrying a wafer or batch of wafers in need of processing and for a clean, empty FOUP are created, and these dirty and clean FOUPs are transmitted to the processing tool. The process flow continues to step 540.

540 Wafers loaded into processing tool? It is then determined whether or not the wafer/batch of wafers have been received at a loading port of the processing tool and transferred into such processing tool. If the wafer/batch of wafers are within the processing tool, the process flow continues to step 545. However, if it is determined that the wafers are not within the processing tool, then step 540 repeats.

545 Create transports to send dirty FOUP to clean. Once it is determined that the wafer/batch of wafers are within the processing tool, the dirty FOUP is now empty and is removed from the loading port of the processing tool. The empty, dirty FOUP is transferred to a cleaning tool for cleaning. The loading port of the processing tool is now empty for receiving another dirty FOUP carrying more wafer(s) in need of processing. The process flow continues to step 550.

550 Wafer processing complete? It is then determined whether the wafer processing is complete. If wafer processing of the batch of wafers within the processing tool is not complete, the process goes back to step 540. However, if it is determined that wafer processing is complete, which signals that the batch of wafers are now processed and ready for transfer into the clean FOUP, then the process flow continues to step 555.

555 Processed wafers unloaded into clean FOUP? Upon wafer processing completion, it is then determined whether or not the processed wafers have been transferred from the processing chamber of the processing tool into the clean FOUP within the processing tool itself. If it is determined that the wafers have not been transferred yet, then step 555 is repeated. On the other hand, once it is determined that the wafers have been transferred into the clean FOUP, the process flow continues to step 560.

560 Create transports for sending clean FOUP to next processing step. The clean FOUP carrying the processed wafer or batch of wafers is transferred to another tool for continued semiconductor fabrication processing. Go to step 565.

565 Any more wafers for processing? Once a batch of wafers within a clean FOUP are removed from the processing tool, and transferred to the next processing operations, the system then determines whether or not there are any more wafer(s) to be processed within the current lot of wafers running on the processing tool. In all aspects of the invention, the foregoing described steps of FOUP swapping from a dirty FOUP to a clean FOUP may be repeated until all wafers have been processed and the tool run time has come to an end. If there are no more wafers to be processed, the process flow goes to step 570.

570 End. The system and process flow ends.

The invention advantageously performs FOUP swapping operations in parallel while the wafers are being processed in a processing tool. In so doing, the invention may be used for contamination control and protection during FOUP swapping. In this aspect, wafers are transferred from a dirty FOUP into a processing tool for processing leaving an empty, dirty FOUP on the processing tool's load port. While the wafers are being processed inside the tool, the dirty FOUP may be replaced with a clean FOUP without holding up the wafer processing operations. For process segregation needs, the invention avoids the use of a mapper tool by completing the swap of one process type FOUP to a different process type FOUP within the processing tool, while the wafers are being processed. The arrival FOUP is removed from the process tool when emptied of wafers, while a departure FOUP of the new process type is made available at the tool. Upon completion of wafer processing, the wafers are placed into the new FOUP type.

The invention may also be used for wafer split operations. The present FOUP swapping performs the separation in parallel to the wafer processing. For example, a dirty FOUP carries 25 wafers, whereby 5 of these 25 wafers are to be split out as a subset. The dirty FOUP carrying the 25 wafers "drops off" the subset of 5 wafers at the split step of the route and continues on its own processing route. While the subset of 5 wafers is being processed within a tool, an empty clean FOUP is loaded into the load port of such tool. When processing of the subset of 5 wafers is complete, this processed subset of wafers is transferred into the clean FOUP and transferred to the next fabrication operation step.

Merge routing/recipe operations may also be performed using the present FOUP swapping within the processing tool. In avoiding the need for an external mapper tool, a clean FOUP carrying processed wafers is transferred from a processing tool to a universal tool for performing a common process step. The processed wafers are loaded into the universal tool. The empty clean FOUP is removed from the universal tool to allow more clean FOUPs carrying other processed wafers be transferred to the universal tool for performing the common process step. Once all the processed wafers are loaded into the universal tool, the entire set of wafers are processed therein and loaded into a single clean FOUP. The invention may also be used during FOUP maintenance by replacing a FOUP in need of repair with a clean FOUP while wafers are being processed, thereby avoiding any delay in wafer processing by eliminating the need for a separate, external mapper or sorter tool.

The present system, methods and apparatus for swapping FOUPs within a processing time internal to a wafer(s) process cycle advantageously eliminates the use of a separate, external mapper or sorter tool. In so doing, the invention reduces contamination during FOUP swapping, reduces robotic transfer means traffic, and as such, reduces processing steps, which in turn, reduces the process cycle time, avoids the reuse of dirty FOUPs, and eliminates additional operation steps as compared to conventional techniques that use a separate, external mapper.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method of swapping pods within a processing tool in an automated material handling system comprising:
   providing a dirty sealed pod carrying a substrate in need of processing;
   receiving said dirty sealed pod at a first loading port of a processing tool for semiconductor fabrication;
   transferring said substrate in need of processing from said dirty sealed pod at said first loading port into a chamber of said processing tool;
   processing said substrate in said chamber by subjecting said substrate to a semiconductor fabrication process;
   removing said dirty sealed pod from said first loading port;
   providing a clean sealed pod prior to completion of processing said substrate; and
   upon completion of processing said substrate, transferring said processed substrate from said chamber into said clean sealed pod such that said dirty and clean sealed pods are integrated within said semiconductor fabrication processing tool for performing said steps within the processing tool run time and eliminating the use of an external tool for swapping said substrate from said dirty sealed pod to said clean sealed pod.

2. The method of claim 1 wherein said dirty sealed pod and said clean sealed pod each comprise front opening unified pods.

3. The method of claim 1 further including transporting said clean sealed pod carrying said processed substrate to another processing tool for continued substrate processing.

4. The method of claim 1 further including a second loading port, wherein said dirty sealed pod is received at said first loading port of said processing tool and said clean sealed pod is received at said second loading port of said processing tool.

5. The method of claim 4 wherein said dirty and clean sealed pods are simultaneously received at said processing tool.

6. The method of claim 4 wherein said dirty and clean sealed pods are concurrently received at said processing tool, said clean sealed pod being received at said processing tool prior to processing completion of said substrate.

7. The method of claim 1 further comprising the steps:
receiving said dirty sealed pod at said first loading port of said processing tool;
transferring said substrate in need of processing from said dirty sealed pod into said chamber;
removing said dirty sealed pod from said first loading port;
receiving said clean sealed pod at said first loading port prior to processing completion of said substrate; and
transferring said processed substrate directly into said clean sealed pod within said first loading port.

8. The method of claim 1 wherein said processed substrate comprises a first processed substrate, said method steps further comprising:
removing said dirty sealed pod from said processing tool;
providing a second dirty sealed pod carrying a second substrate in need of processing within said processing tool;
transferring said first processed substrate from said chamber directly into said clean sealed pod within said processing tool;
transferring said second substrate from said second dirty sealed pod into said chamber of said processing tool; and
providing a second clean sealed pod within said processing tool prior to processing completion of said second substrate.

9. The method of claim 8 wherein said second substrate is transferred into said chamber simultaneously as said first substrate is transferred into said clean sealed pod.

10. The method of claim 8 wherein said second substrate is transferred into said chamber after said first substrate has been transferred into said clean sealed pod.

11. The method of claim 8 further including repeating said processing steps until all desired substrates have been processed within said processing tool.

12. The method of claim 1 further including said dirty sealed pod carrying a plurality of substrates in need of processing, said plurality of substrates residing in a wafer cassette which is transferred from said dirty sealed pod into said processing tool for processing said substrates within said chamber of said processing tool.

13. The method of claim 12 wherein said plurality of processed substrates are transferred from said chamber into said clean sealed pod at said processing tool.

14. The method of claim 12 further comprising:
processing said plurality of substrates within said chamber;
providing a plurality of clean sealed pods within said processing tool prior to processing completion of said plurality of substrates;
separating said plurality of processed substrates into subsets of processed substrates; and
transferring said subsets of processed substrates from said chamber directly into said plurality of clean sealed pods within said processing tool.

15. The method of claim 1 wherein said step of transferring said processed substrate from said chamber into said clean sealed pod within said processing tool significantly reduces contamination of said processed substrate.

16. A program storage device readable by a processor capable of executing instructions, tangibly embodying a program of instructions executable by the processor to perform method steps for swapping pods within a processing tool in an automated material handling system, said method steps comprising:
providing a dirty sealed pod carrying at least one substrate in need of processing;
receiving said dirty sealed pod at a first loading port of a processing tool for semiconductor fabrication;
transferring said at least one substrate in need of processing from said dirty sealed pod at said first loading port into a chamber of said processing tool;
processing said at least one substrate in said chamber by subjecting said substrate to a semiconductor fabrication process;
removing said dirty sealed pod from said first loading port;
providing at least one clean sealed pod prior to completion of processing said substrate; and
upon completion of processing said substrate, transferring said processed at least one substrate from said chamber into said at least one clean sealed pod such that said dirty and clean sealed pods are integrated within said semiconductor fabrication processing tool for performing said steps within the processing tool run time and eliminating the use of an external tool for swapping said substrate from said dirty sealed pod to said clean sealed pod.

17. The method of claim 1 wherein said substrate resides in a wafer cassette in each of said dirty and clean sealed pods, whereby said clean sealed pod transports said processed substrate residing in said wafer cassette to another processing tool for continued substrate processing.

* * * * *